US008395887B2

(12) United States Patent
Zhang et al.

(10) Patent No.: US 8,395,887 B2
(45) Date of Patent: Mar. 12, 2013

(54) COVER MECHANISM AND ELECTRONIC DEVICE USING SAME

(75) Inventors: Xiao Zhang, Shenzhen (CN); Yong-Gang Zhang, Shenzhen (CN); Kuan-Hung Chen, Shindian (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 165 days.

(21) Appl. No.: 12/974,191

(22) Filed: Dec. 21, 2010

(65) Prior Publication Data

US 2012/0019992 A1 Jan. 26, 2012

(30) Foreign Application Priority Data

Jul. 22, 2010 (CN) .......................... 2010 1 0233867

(51) Int. Cl.
*H05K 7/00* (2006.01)
*H05K 5/02* (2006.01)

(52) U.S. Cl. ......... 361/679.01; 361/679.02; 361/679.37; 361/679.38; 361/679.39; 361/679.41; 361/679.42; 361/679.43; 361/679.44; 361/679.45

(58) Field of Classification Search ............. 361/679.02, 361/679.37–679.45
See application file for complete search history.

(56) References Cited

U.S. PATENT DOCUMENTS

2006/0154520 A1* 7/2006 Gennai et al. ................. 439/578
2007/0275772 A1* 11/2007 Moon et al. ................ 455/575.1

FOREIGN PATENT DOCUMENTS

CN 101079911 A 11/2007

* cited by examiner

*Primary Examiner* — Tuan T Dinh
*Assistant Examiner* — Mukund G Patel
(74) *Attorney, Agent, or Firm* — Altis Law Group, Inc.

(57) ABSTRACT

A cover mechanism is for protecting an interface of an electronic device. The cover mechanism includes a housing and a protective cover. The housing forms an extending plate. The protective cover includes a plug and a latching post. The plug is for covering the interface, and the latching post is rotatably attached to the extending plate.

5 Claims, 6 Drawing Sheets

COVER MECHANISM AND ELECTRONIC DEVICE USING SAME

BACKGROUND

1. Technical Field

The present disclosure relates to cover mechanisms used in electronic devices (e.g., mobile phones).

2. Description of Related Art

Electronic devices usually have external interfaces (e.g., universal serial bus (USB)) for electrically connecting to peripheral devices (e.g., printers), accessories (e.g., USB flash drives) or other electronic devices. Such external interfaces should be protected by cover mechanisms from e.g., dust or water, to maintain proper functioning.

The cover mechanisms usually include a cover and a lock. The covers are typically locked to the electronic devices by latches to cover the area through which the interfaces of electronic devices are exposed. However, the covers are often not fixed or tethered to the electronic devices. Thus, the covers may easily be misplaced or lost when not locked to the electronic devices.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present cover mechanism. Moreover, in the drawings, like reference numerals designate corresponding parts throughout the several views, in which.

DETAILED DESCRIPTION

Figure 1:
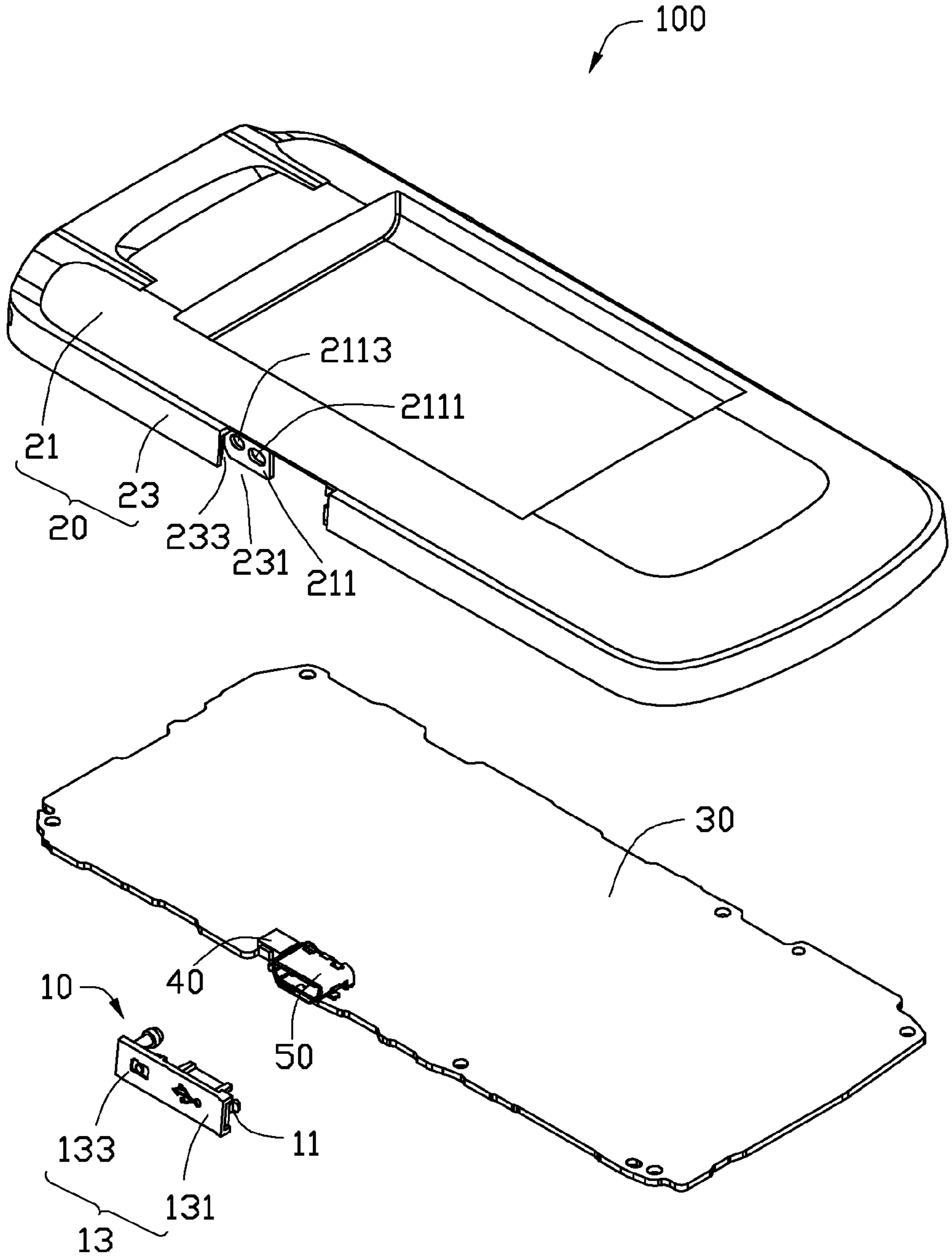
FIG. 1 is an exploded, isometric view of an exemplary cover mechanism used in an electronic device.

FIG. 1 shows an exemplary embodiment of a cover mechanism 100 used with an electronic device, such as a mobile phone.

The cover mechanism 100 includes a protective cover 10, a housing 20, a printed circuit board (PCB) 30, a switch 40, and an interface 50. The switch 40 and the interface 50 are positioned on the PCB 30. The interface 50 is exposed from the housing 20. The protective cover 10 is for shielding the interface 50 and for activating the switch 40.

Figure 2:
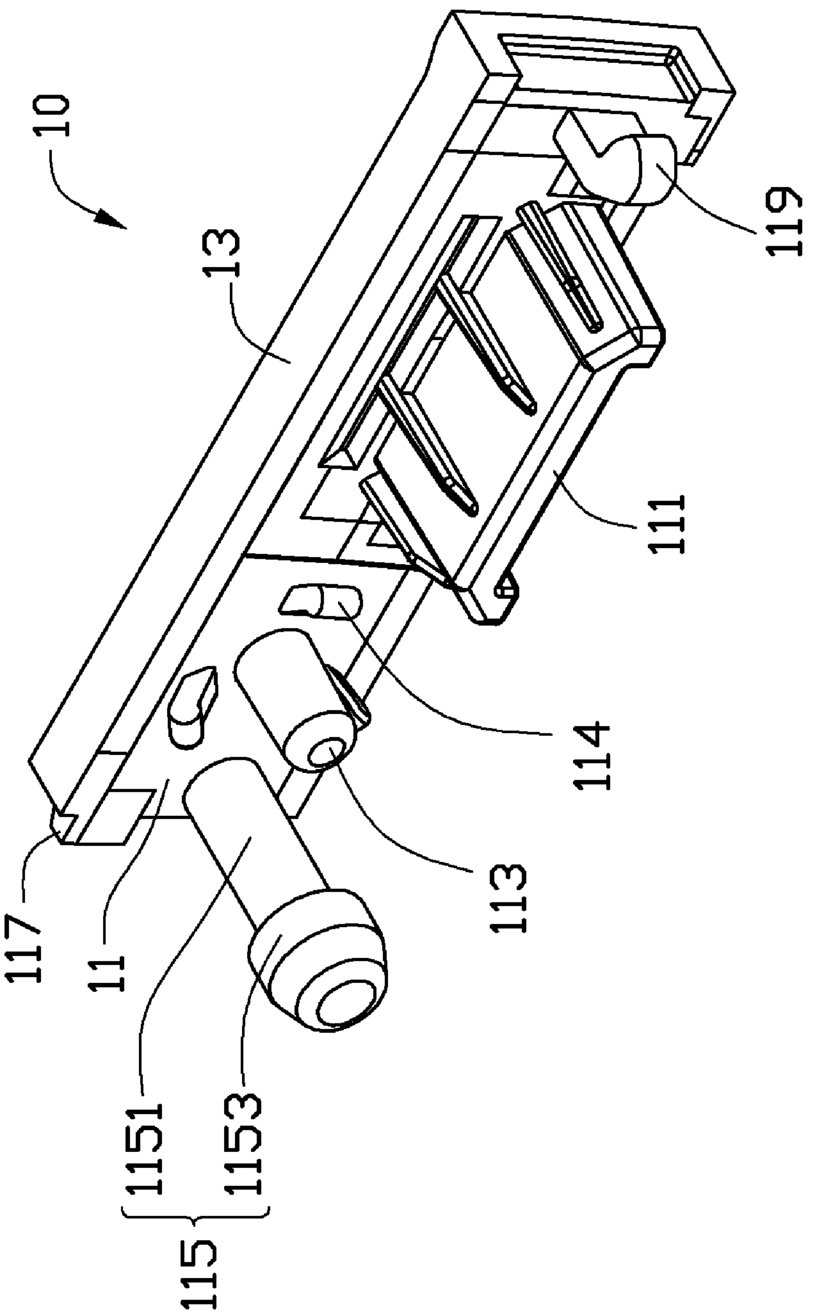
FIG. 2 is an enlarged view of protective cover in FIG. 1.

Referring to FIG. 2, the protective cover 10 includes a base portion 11 and a cover portion 13 made of a different hardness material than the base portion by double-colored injection molding. In an exemplary embodiment, the base portion 11 is made of soft material such as thermoplastic polyurethanes (TPU), and the cover portion 13 is made of hard material such as polycarbonate (PC).

The base portion 11 includes a plug 111, a plurality of elastic arms 114, a latching post 115, and a hook 119. The plug 111 is for filling the interface 50 for preventing electrical contacts in the interface 50 from being contaminated. The elastic arms 114 are oriented at some angle relative to the base portion 11. The latching post 115 includes a shaft portion 1151 and a head portion 1153 integrally formed together. The head portion 1153 has a larger diameter than the shaft portion 1151. The latching post 115 and the hook 119 latch the protective cover 10 to the housing 20. The cover portion 13 is embedded in the base portion 11, and includes a pin 113 extending through the base portion 11. The pin 113 is surrounded by the elastic arms 114. When the pin 113 is pressed, the elastic arms 114 provide return force to the pin 113. A block 117 is formed at one end of the cover portion 13. An outer surface of the cover portion 13 includes an operating end 131 and a pressing area 133. The operating end 131 is opposite to the block 117. The pressing area 133 corresponds to the pin 113 disposed at an opposite side.

Figure 3:
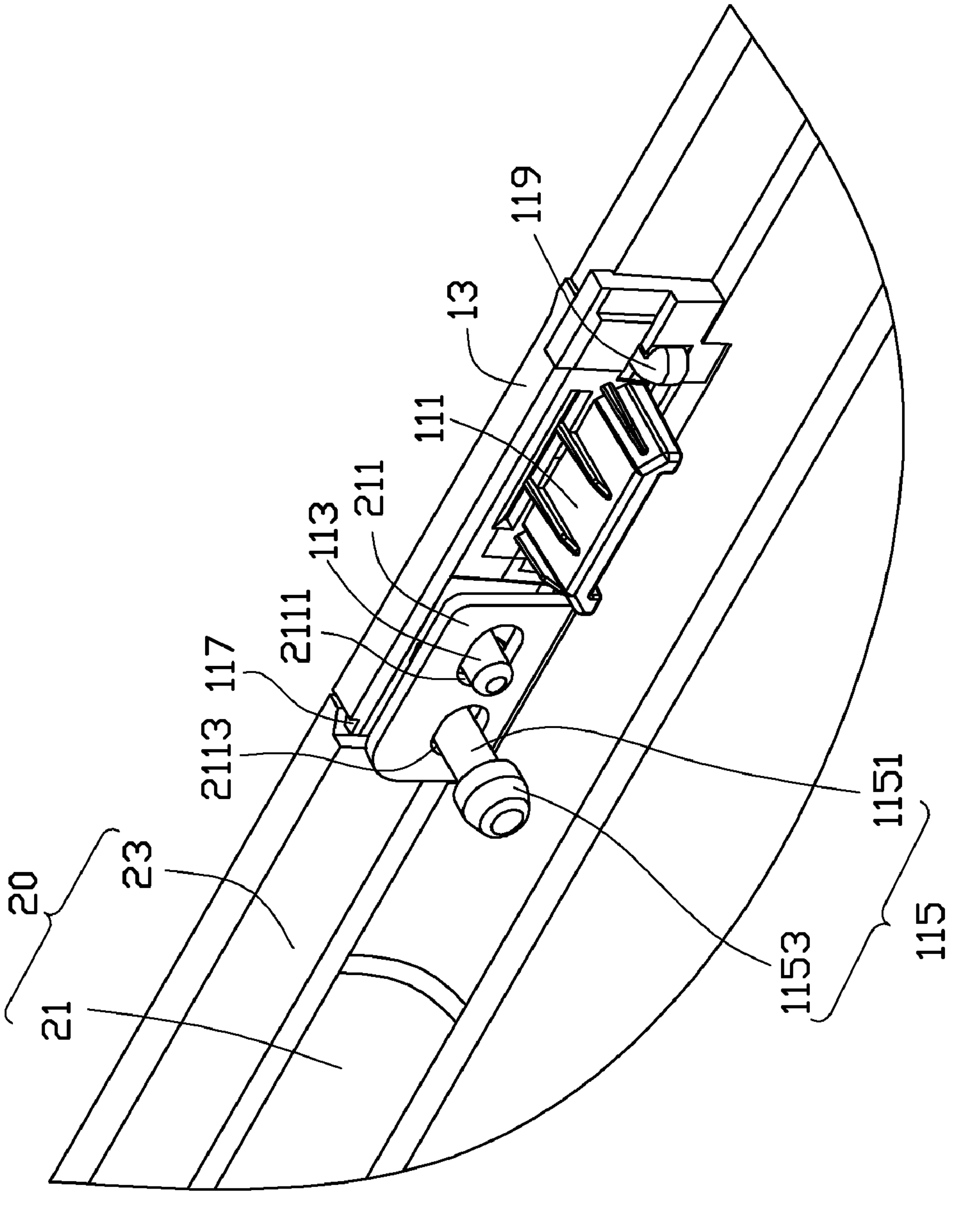
FIG. 3 is an isometric view showing the protective cover attached to the housing from inside.

Referring to FIGS. 1 and 3, the housing 20 may be portions of the electronic device and includes a main wall 21 and a sidewall 23 perpendicular to the main wall 21. The sidewall 23 has a rectangular opening 231 and an extending plate 211 received in the opening 231. The extending plate 211 is spaced from the sidewall 23, and thus defines a receiving groove 233 for containing the block 117 of the protective cover 10. The extending plate 211 defines a first hole 2111 and a second hole 2113.

Figure 4:
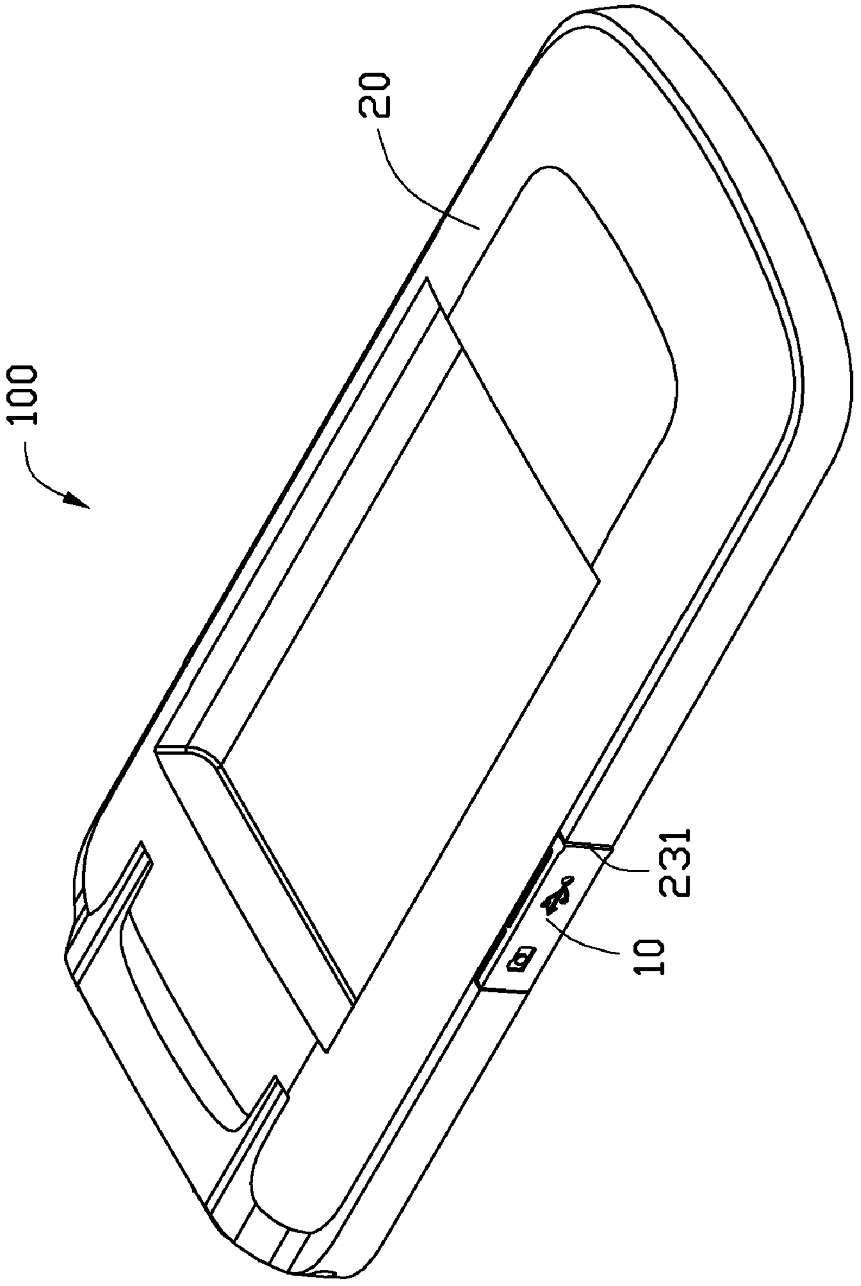
FIG. 4 is an assembled, isometric view of the exemplary cover mechanism shown in FIG. 1.
Figure 5:
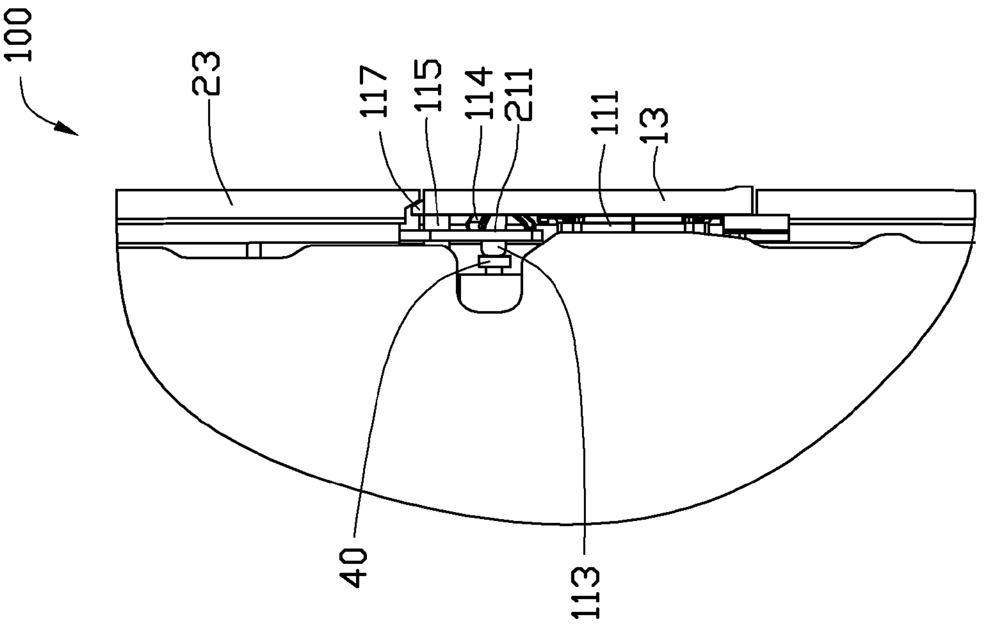
FIG. 5 is a bottom view of the cover mechanism of FIG. 4.

In FIGS. 4-5, when the cover mechanism 100 is assembled, firstly, the PCB 30 is positioned in the housing 20, and allows the switch 40 to be aligned with the first hole 2111. The protective cover 10 is aligned with the rectangular opening 231. The head portion 1153 of the latching post 115 deformedly extends through the second hole 2113 to allow the cover 10 to be fixed to the housing 20. The block 117 is received in the receiving groove 233. The plug 11 is received in the interface 50, and the pin 113 extends through the first hole 211 to allow the pin 113 to be aligned with the switch 40. The hook 119 is latched to the sidewall 23. Thus, the cover mechanism 100 is completely assembled.

Figure 6:
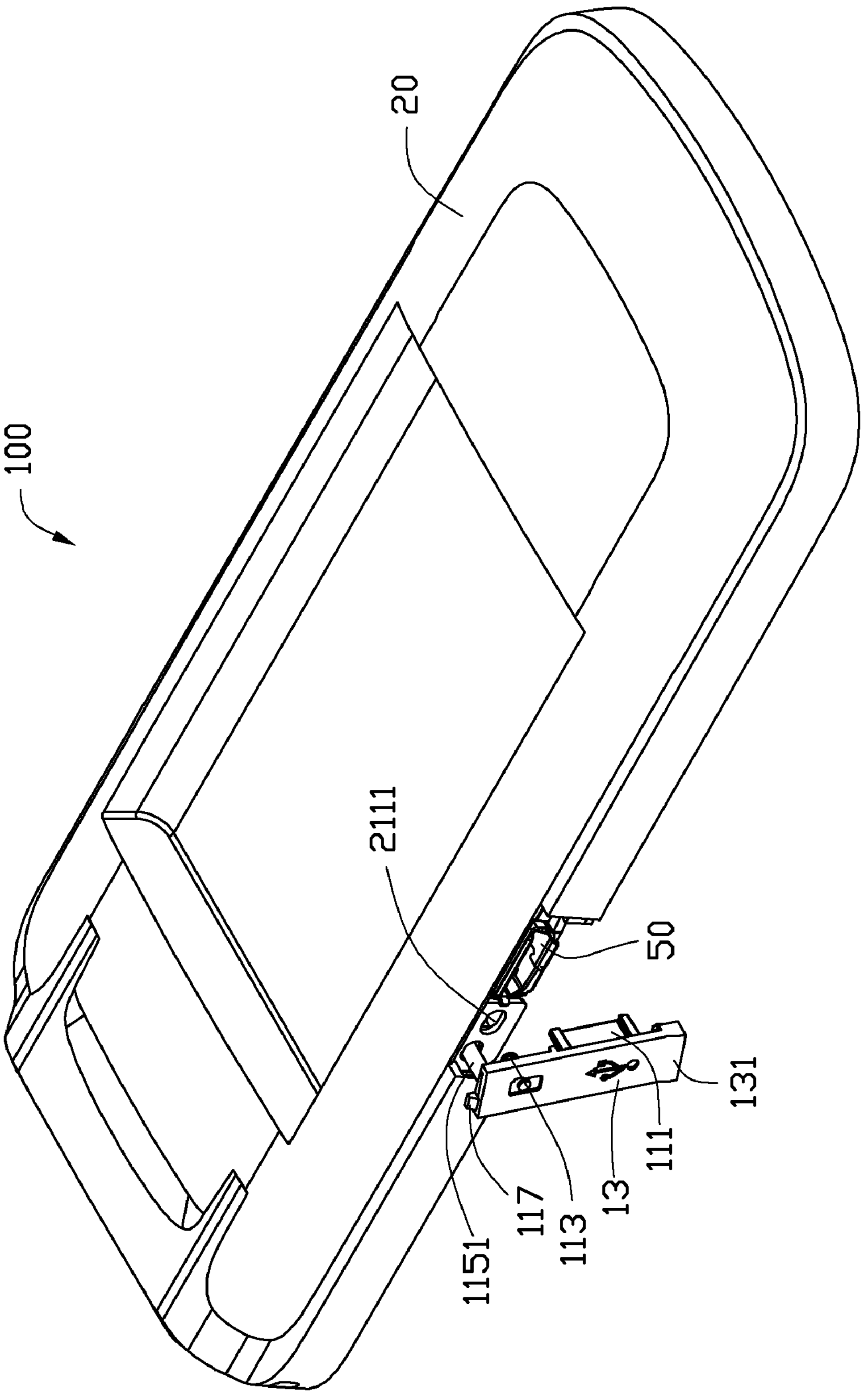
FIG. 6 is an opened position of the cover mechanism.

To activate the switch 40, the operator presses the pressing portion 133. The pin 113 is caused to move to the switch 40 and activate the switch 40. The elastic arms 114 provide return force to the pin 113. Referring to FIG. 6, when the cover 10 is opened, the operator may turn the operating end 131 to allow the plug 111 to be separated from the interface 50. The cover 10 may be rotated around the latching post 115 to provide more operating space. Thus, the interface 50 is exposed from the cover 10 for insertion of one of various kinds of plugs.

To close and lock the cover mechanism 100, the above process is reversed and the cover 10 moved from the opened position to the closed position.

It is believed that the present embodiments and their advantages will be understood from the foregoing description, and it will be apparent that different changes may be made thereto without departing from the spirit and scope of the disclosure or sacrificing all of its material advantages, the examples hereinbefore described merely being preferred or exemplary embodiments of the disclosure.

What is claimed is:

1. A cover mechanism for protecting an interface of an electronic device, the cover mechanism comprising:

a housing including a sidewall defining an opening and an extending plate received in the opening, the extending plate spaced from the sidewall and a receiving groove defined between the extending plate and the sidewall;

a protective cover including a base portion and a cover portion made of different material, the base portion including a block a hook a plug and a latching post, the latching post and the hook located at opposite ends of a side surface of the base portion, the plug extending from the side surface of the base portion and positioned between the latching post and the hook a block positioned at an end surface of the cover portion and adjacent to the latching post, the plug for covering the interface, and the latching post rotatably attached to the extending plate, the block received in the receiving groove and the hook latched to the sidewall, and wherein the protective cover includes a pin and a plurality of elastic arms, the pin is disposed between the latching post and the plug, and surrounded by the elastic arms, the elastic arms provide return force to the pin.

2. The cover mechanism as claimed in claim 1, wherein the base portion is made of soft material, and the cover portion is made of hard material.

3. The cover mechanism as claimed in claim 2, wherein the base portion is made of thermoplastic polyurethanes, and the cover portion is made of polycarbonate.

4. The cover mechanism as claimed in claim 1, wherein the extending plate defines a first hole and a second hole, the pin extends through the first hole and the latching post extends through the second hole.

5. The cover mechanism as claimed in claim 1, wherein the latching post includes a shaft portion and a head portion integrally formed together, and the head portion has a larger diameter than the shaft portion.

* * * * *